(12) United States Patent
Shaddock et al.

(10) Patent No.: US 8,405,996 B2
(45) Date of Patent: Mar. 26, 2013

(54) ARTICLE INCLUDING THERMAL INTERFACE ELEMENT AND METHOD OF PREPARATION

(75) Inventors: David Mulford Shaddock, Troy, NY (US); Deng Tao, Clifton Park, NY (US); Hendrik Pieter Jacobus De Bock, Clifton Park, NY (US); Dalong Zhong, Niskayuna, NY (US); Christopher Michael Eastman, Ballston Lake, NY (US); Kevin Matthew Durocher, Waterford, NY (US); Stanton Earl Weaver, Jr., Northville, NY (US)

(73) Assignee: General Electric Company, Niskayuna, NY (US)

(*) Notice: Subject to any disclaimer, the term of this patent is extended or adjusted under 35 U.S.C. 154(b) by 174 days.

(21) Appl. No.: 12/826,337

(22) Filed: Jun. 29, 2010

(65) Prior Publication Data
US 2010/0328896 A1 Dec. 30, 2010

Related U.S. Application Data

(63) Continuation-in-part of application No. 12/494,775, filed on Jun. 30, 2009.

(51) Int. Cl.
*H05K 7/20* (2006.01)
(52) U.S. Cl. ........ 361/710; 361/704; 361/708; 361/709; 165/185; 428/408
(58) Field of Classification Search .................. 361/688, 361/701–722
See application file for complete search history.

(56) References Cited

U.S. PATENT DOCUMENTS

| | | | |
|---|---|---|---|
| 4,385,310 A | 5/1983 | Houston | |
| 5,660,917 A * | 8/1997 | Fujimori et al. | 428/195.1 |
| 6,248,422 B1 | 6/2001 | Robbie et al. | |
| 6,324,060 B1 | 11/2001 | Hsu | |
| 6,504,292 B1 * | 1/2003 | Choi et al. | 313/310 |
| 6,896,045 B2 | 5/2005 | Panek | |
| 6,947,295 B2 | 9/2005 | Hsieh | |
| 7,535,099 B2 | 5/2009 | Suh et al. | |
| 2003/0071246 A1 * | 4/2003 | Grigorov et al. | 252/500 |
| 2003/0117770 A1 * | 6/2003 | Montgomery et al. | 361/687 |
| 2004/0261987 A1 * | 12/2004 | Zhang et al. | 165/183 |
| 2005/0006754 A1 * | 1/2005 | Arik et al. | 257/712 |
| 2006/0234056 A1 * | 10/2006 | Huang et al. | 428/408 |
| 2008/0057279 A1 | 3/2008 | Fang | |

(Continued)

FOREIGN PATENT DOCUMENTS

| | | |
|---|---|---|
| EP | 0651603 B1 | 12/1996 |
| EP | 0413498 B1 | 11/1998 |

(Continued)

OTHER PUBLICATIONS

Deng Tao et al.; Thermal Interface Element and Article Including the Same; U.S. Appl. No. 12/494,775, filed Jun. 30, 2009; 17 Pages.

(Continued)

*Primary Examiner* — Courtney Smith
(74) *Attorney, Agent, or Firm* — Paul J. DiConza

(57) ABSTRACT

An article and method of forming the article is disclosed. The article includes a heat source, a heat-sink, and a thermal interface element having a plurality of freestanding nanosprings, a top layer, and a bottom layer. The nanosprings, top layer, and the bottom layers of the article include at least one inorganic material. The article can be prepared using a number of methods including the methods such as GLAD and electrochemical deposition.

23 Claims, 6 Drawing Sheets

U.S. PATENT DOCUMENTS

2009/0237886 A1* 9/2009 Iwai et al. .................. 361/708
2009/0269604 A1 10/2009 Wang et al.
2011/0180783 A1* 7/2011 Gao ............................ 257/15

FOREIGN PATENT DOCUMENTS

EP  0914494 B1  11/2004
EP  2112249 A1  10/2009

OTHER PUBLICATIONS

Compressible TIM (SMA-TIM) Heat-Spring; Thermal Interface Materials; URL : http://www.indium.com/TIM/solutions/heatspringtim1.php; 1 Page.

* cited by examiner

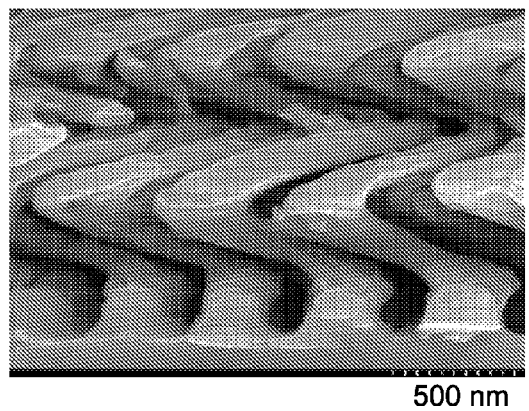
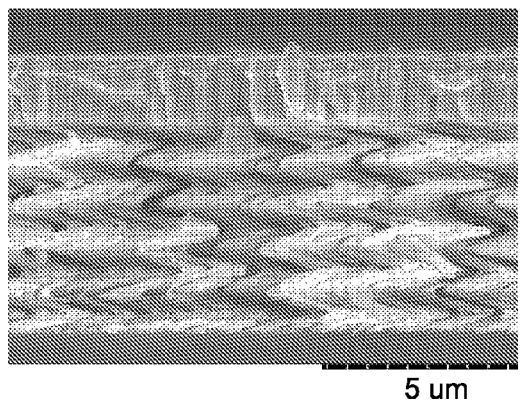
FIG. 8          FIG. 9
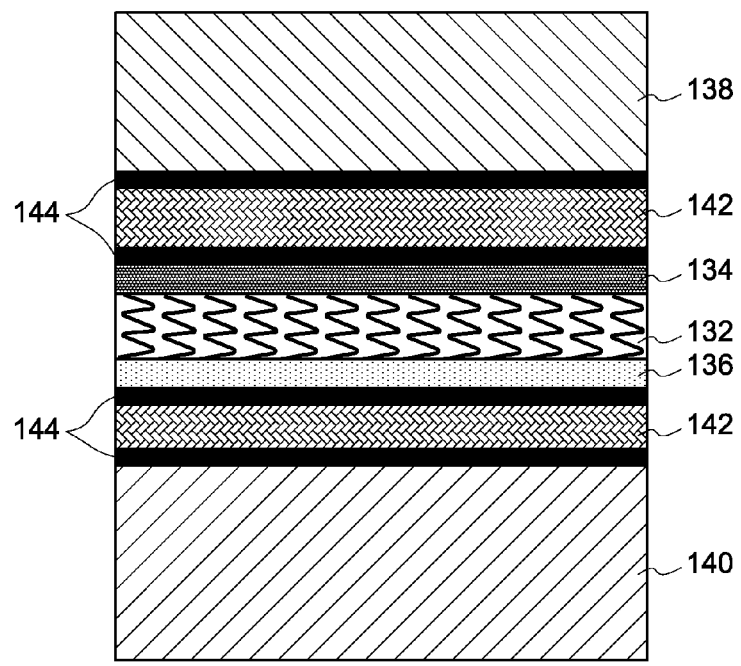
FIG. 10

ARTICLE INCLUDING THERMAL INTERFACE ELEMENT AND METHOD OF PREPARATION

This application is a continuation in part of the co-pending U.S. patent application Ser. No. 12/494,775, entitled "THERMAL INTERFACE ELEMENT AND ARTICLE INCLUDING THE SAME", filed on Jun. 30, 2009.

STATEMENT REGARDING FEDERALLY SPONSORED RESEARCH & DEVELOPMENT

This invention was made with Government support under contract number N66001-09-C-2014, awarded by The Defense Advanced Research Projects Agency. The Government has certain rights in the invention.

BACKGROUND

This invention relates generally to an article including a thermal interface element and method of preparing the article.

Over the last decades, power densities of high performance semiconductor devices have been constantly on the rise. Thermal management of these electronics, more specifically the performance of Thermal Interface Materials (TIMs), has not advanced at the same rate as the semiconductor devices. Hence, today's high performance semiconductors are either run at only a fraction of their capacity or are prone to thermal related failures. Although TIMs have progressed during the last decade, they are still the thermal bottleneck in most high power applications.

TIMs play a key role in the thermal management of electronic systems by providing a path of low thermal resistance between the heat generating devices and the heat spreader/sink. A second function that a TIM performs is to reduce stresses resulting from global CTE mismatch between die, heat-sink, and substrate during power cycling. Typical TIM solutions include adhesives, greases, gels, phase change materials, pads, and solder alloys. Most traditional TIMs consist of a polymer matrix, such as an epoxy or silicone resin, and thermally conductive fillers such as boron nitride, alumina, aluminum, zinc oxide, and silver. However, these traditional TIM systems have either high thermal resistance or low compliance.

An ideal TIM is expected to have optimal thermal and mechanical properties and to be compatible with the present standard electronics assembly processes. Desirable properties of TIM include low bulk and interface thermal resistances, sufficient compliance to absorb thermally induced strain without causing early fatigue failure and silicon die fracture, sufficient conformability to accommodate warpage and surface roughness of the die and heat-sink surfaces, processability at relatively low temperatures, robustness during storage and operation, and reworkability.

Therefore, there is a need for providing a compatible, highly heat dissipating material, design and processes for conducting heat away from the heat producing components in the electronic industry.

BRIEF DESCRIPTION

One embodiment of the present invention is an article including a heat source, a heat-sink, and a thermal interface element. The thermal interface element is disposed in thermal communication with the heat source and the heat-sink and includes a top layer, a bottom layer, and a plurality of freestanding nanosprings between the top layer and bottom layers such that the plurality of nanosprings, top layer, and the bottom layers comprise at least one inorganic material.

In one embodiment of the present invention, a method of preparing an article is disclosed. The method includes providing a heat source, providing a heat-sink, and disposing a thermal interface element in thermal communication with the heat source and the heat-sink. The thermal interface element includes a top layer, a bottom layer, and a plurality of free-standing nanosprings between the top layer and bottom layers such that the plurality of nanosprings, top layer, and the bottom layers comprise at least one inorganic material.

DRAWINGS

These and other features, aspects, and advantages of the present invention will become better understood when the following detailed description is read with reference to the accompanying drawings in which like characters represent like parts throughout the drawings, wherein:

FIG. 8 is a scanning electron micrograph of the nanosprings in an example.

FIG. 9 is a scanning electron micrograph of the nanosprings in an example.

FIG. 10 is an example of a thermal interface element prepared using nanosprings bonded between a heat source and heat sink with solder.

DETAILED DESCRIPTION

Embodiments of the present invention describe an article including a heat source, heat-sink, and a thermal interface element and an associated method of preparation of the article.

In the following specification and the claims that follow, the singular forms "a", "an" and "the" include plural referents unless the context clearly dictates otherwise.

Figure 1:
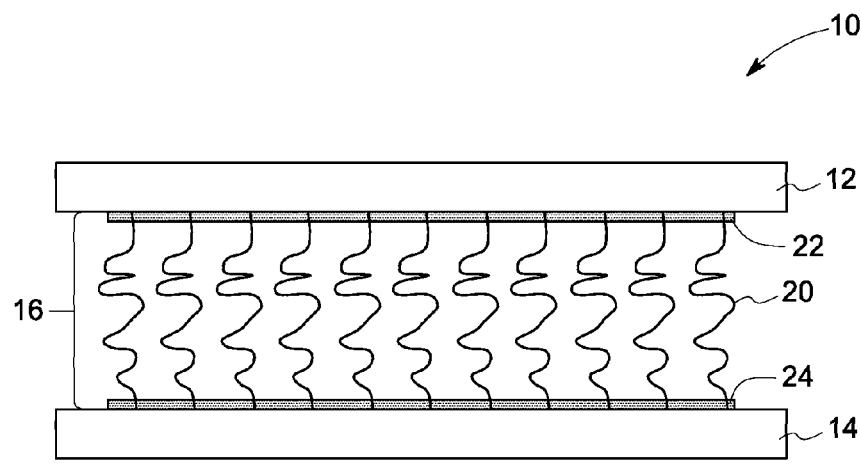
FIG. 1 is a diagrammatical cross-sectional representation of a system according to one embodiment of the invention.

One embodiment of the present invention describes an article having a thermal interface element, which typically facilitates heat transfer among article components and/or out of the article altogether. FIG. 1 depicts an article 10 including at least one heat source 12 and at least one heat-sink 14. Heat source 12 is any component of the article that is configured to generate some quantity of thermal energy. Examples of heat sources include heat-generating components of different devices such as optical devices, solar cells, power generation devices, and energy storage devices. In one embodiment, the article is an electronic device. In the electronic device, in one embodiment, the heat source is an electronic component that produces heat during operation of the electronic device. In another embodiment, the heat source is a semiconductor chip. In yet another embodiment, the heat source is a printed circuit board (PCB). In one more embodiment, the heat source is a heat spreader connected to a single or plurality of electronic devices.

In one embodiment, the heat-sink 14 is a component acting as a heat spreader. A heat spreader can absorb heat from one source and spread to the surrounding or to the selected heat-sinks. A heat-sink is capable of drawing heat from a heat source. In one embodiment, the heat-sink 14 has a thermal conductivity greater than about 1 watt/mK. In another embodiment, the heat-sink 14 has a thermal conductivity greater than about 10 watt/mK. The article 10 also comprises at least one thermal interface element 16 disposed in thermal communication with the heat-sink 14 and the heat source 12. The thermal interface element includes a plurality of nanosprings 20, a top layer 22, and a bottom layer 24. As used herein, the term "nanospring" means a structure having at least one dimension that measures less than 10 μm and that has an initial shape that is compliant under an applied load and returns to substantially the initial shape upon removal of the load. As used herein, the term "substantially" is accommodative of up to about 5% deviation in the initial shape of the nanosprings. The term "compliant" refers to the quality of having a reversible deformation in a load-unload cycle. "Reversible deformation" is an elastic deformation in the range of about 1% to 1000% of coefficient of thermal expansion (CTE) mismatch of the heat-sink and heat source.

In one embodiment, the top layer 22 and the bottom layer 24 assist in the structural integrity and thermal communication of the thermal interface element 16 with the heat source 12 and the heat-sink 14. In one embodiment, the top layer 22 has an accommodative coefficient of thermal expansion (CTE) with the heat source and the material of the nanosprings 20. "Accommodative CTE" as used herein is a CTE within 20% of the CTE of the top layer, the source, or both.

In one embodiment, the bottom layer 24 has an accommodative coefficient of thermal expansion (CTE) with the heat-sink and the material of the nanosprings 20. As used herein, the "top" and "bottom" are used for the convenience of description and are not to be limiting for their interchange in any article 10 for any application.

The thermal interface element 16 is an element that transmits heat from a heat source 12. In one embodiment, the thermal interface element 16 is an element to transmit heat from a heat source 12 to one or more heat-sinks. In the article of the present embodiment, the thermal interface element 16 primarily transmits heat from the heat source 12 to the heat-sink 14. In another embodiment, the thermal interface element 16 also transmits heat to the surroundings (not shown) along with transmitting heat to the heat-sink 14.

According to one embodiment, the plurality of nanosprings 20 is freestanding. As used herein, the term "freestanding" means "without a supporting solid or liquid matrix filling the void space between individual springs". Thus, apart from top layer 22 and bottom layer 24, the nanosprings do not have any solid or liquid matrix filling in the void space between them.

Figure 2:
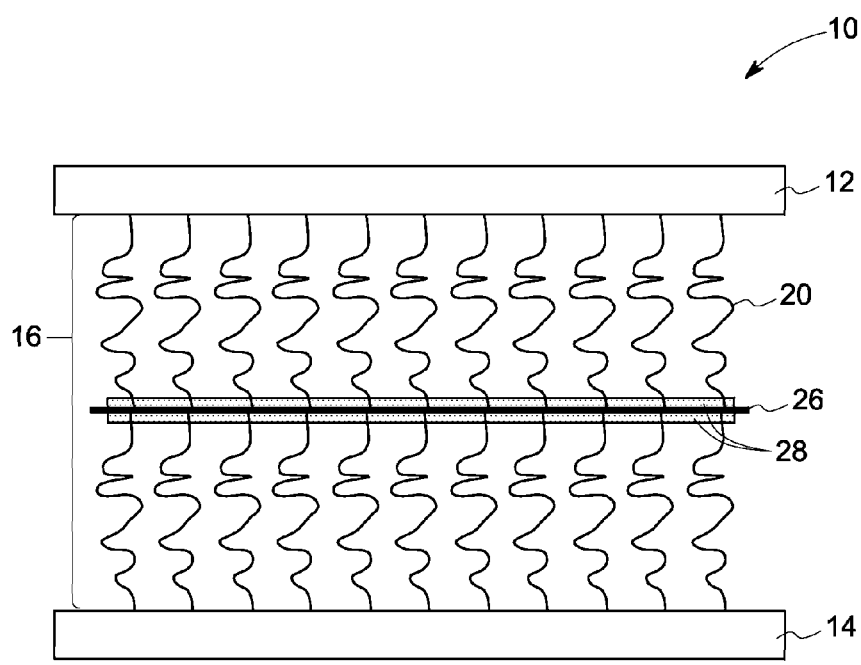
FIG. 2 is a diagrammatical cross-sectional representation of a system according to one embodiment of the invention.

In one embodiment, the plurality of nanosprings 20 is disposed on a support. In one embodiment, the heat-sink 14 of the article itself acts as a support for the plurality of nanosprings 20, while in another embodiment, a bottom layer 24 is used to support the nanosprings 20. In one exemplary embodiment, as depicted in FIG. 2, the nanosprings 20 are disposed on at least two sides of a separate support 26. The support 26, along with the nanosprings 20 is positioned between the heat source 12 and the heat-sink 14 such that the nanosprings 20 on one side of the support 26 are in thermal communication with the heat source 12 and the nanosprings 20 on the other side of the support 26 are in thermal communication with the heat-sink 14. Optionally, an adhesive layer 28 may exist between the support 26 and the nanosprings 20. In one embodiment, the adhesive layer 28 has similar thermal conductivity and bonding characteristic as that of top layer and/or bottom layer.

Figure 3:
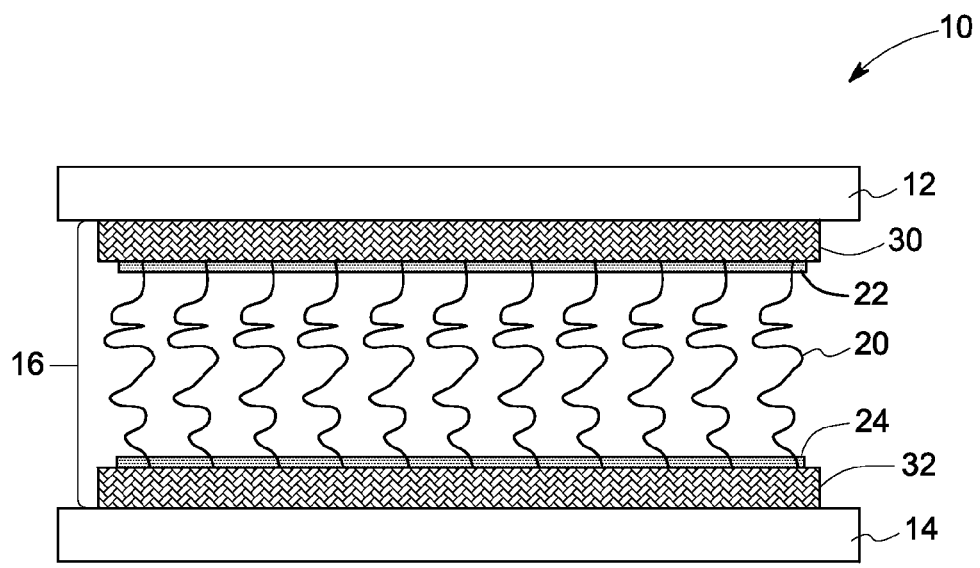
FIG. 3 is a diagrammatical cross-sectional representation of a system according to one embodiment of the invention.

In one embodiment, the nanosprings 20 are in thermal communication with the heat source 12 as well as with the heat-sink 14. As used herein and the rest of the specification, the term "in thermal communication" refers to the ability of an element of the article to conduct heat from another element. Therefore, when the nanosprings 20 are in thermal communication with the heat source 12 and the heat-sink 14, the nanosprings 20 conduct heat from the heat source 12 to the heat-sink 14 through the top layer 22 and bottom layer 24. The top layer 22 may or may not directly receive the heat from the heat source 12 and the bottom layer 24 may or may not directly deliver the heat to the heat-sink 14. There may be intervening materials in between the heat source 12 and the top layer 22 and/or in between the heat-sink 24 and the bottom layer 24, for example, as depicted in FIG. 3 in the form of one or more layers 30, 32. In one embodiment, the intervening material between the heat source 12 and the top layer 22 and/or in between the heat-sink 24 and the bottom layer 24 is a thermoelectric material. However, in one specific embodiment, the top layer 22 is in contact with the heat source 12 and the bottom layer 24 is in direct thermal contact with the heat-sink 14. The term "contact" as used herein means that thermal communication is accomplished without any intervening material other than the material of the heat source 12, heat-sink 14, the nanosprings 20, top layer 22, bottom layer 24, and the optional support 22. In yet another embodiment, the heat source 12, top layer 22, bottom layer 24, heat-sink 14, any intervening layers 30, 32, or any combination of any of the foregoing is a thermo electric material.

In one embodiment, the nanosprings 20, top layer 22, and bottom layer 24 comprise at least one inorganic material. The inorganic material is any material that does not comprise a carbon-to-carbon bond. In one embodiment, the inorganic material comprises a metallic material, an alloy, a ceramic, or a composite. In one embodiment, the inorganic material comprises copper, aluminum, silver, gold, platinum, tungsten, silicon, zinc oxide, silicon nitride, titanium, molybdenum, tantalum, or any combinations of these materials. In one embodiment, the inorganic material of the top and bottom layers include an alloy of copper, aluminum, silver, gold, platinum, tungsten, silicon, zinc oxide, silicon nitride, titanium, or any combinations of these materials.

In one embodiment, the nanosprings 20, top layer 22, and bottom layer 24 comprise one or more organic materials along with inorganic materials. The combination of the organic and inorganic materials may include a composite of organic and inorganic materials. In another embodiment, the nanosprings 20, top layer 22, and bottom layer 24 consist essentially of inorganic materials. In this embodiment, any organic material that may be present is in the form of impurities. In one particular embodiment, the inorganic material consists of highly thermally conductive metals such as, for example, copper, silver, gold, and platinum.

In one embodiment, more than 50% of the nanosprings 20 of the thermal interface element 16 have a thermal conductivity greater than 1 watt/mK per nanospring, and in certain embodiments this percentage is more than 75%. In another embodiment, more than 50% of the nanosprings 20 have a thermal conductivity greater than 10 watt/mK per nanospring and in certain embodiments this percentage is more than 75%.

In yet another embodiment, more than 75% of the nanosprings 20 have a thermal conductivity greater than 100 watt/mK per nanospring.

In one embodiment, the top layer 22 and bottom layer 24 have a thermal conductivity greater than about 10 watt/mK. In a further embodiment, the top layer 22 and bottom layer 24 have a thermal conductivity greater than about 100 watt/mK. In a specific embodiment, the thermal interface element 16 has a thermal conductivity greater than about 100 watt/mK.

In one embodiment, the nanosprings 20, as a group, have a median spring diameter less than about 2 micrometers. The "spring diameter" used herein is not indicative of any structure of the nanosprings but is indicative of the cross sectional width of the nanosprings. The "cross sectional width" refers to the largest dimension in a cross section of nanosprings 20 in a direction perpendicular to the length of the nanospring at any given point of the nanosprings 20. For example, if a nanospring of certain length is of a regular rectangular shape all throughout the length of the nanospring, the cross sectional width is the diagonal length of the rectangle in a direction perpendicular to the length of the nanospring. In an example with cylindrical nanosprings 20 of different diameters through the length, the cross sectional width is the largest diameter of the nanosprings 20 in a direction perpendicular to the length of the nanosprings. In a further embodiment, the median spring diameter of the plurality of nanosprings 20 is in a range from about 10 nm to about 2 µm. In a specific embodiment, the plurality of nanosprings 20 has a median spring cross sectional width in a range from about 100 nm to about 1 µm.

In one embodiment, there can be a number of nanosprings 20 in thermal communication at a particular area of top layer 22 or bottom layer 24. In general, as the number of nanosprings with physical contact with a surface in a particular area increases, the thermal conductivity between the nanosprings and the surface also increases. In one embodiment of the present invention, the thermal interface element 16 comprises at least about $10^5$ nanosprings 20 in 1 cm$^2$ of area. In a further embodiment, the thermal interface element 16 comprises at least about $10^7$ nanosprings 20 in 1 cm$^2$ of area. In a further, specific embodiment, the thermal interface element 16 comprises at least about $10^8$ nanosprings 20 in 1 cm$^2$ of area.

Figure 4:
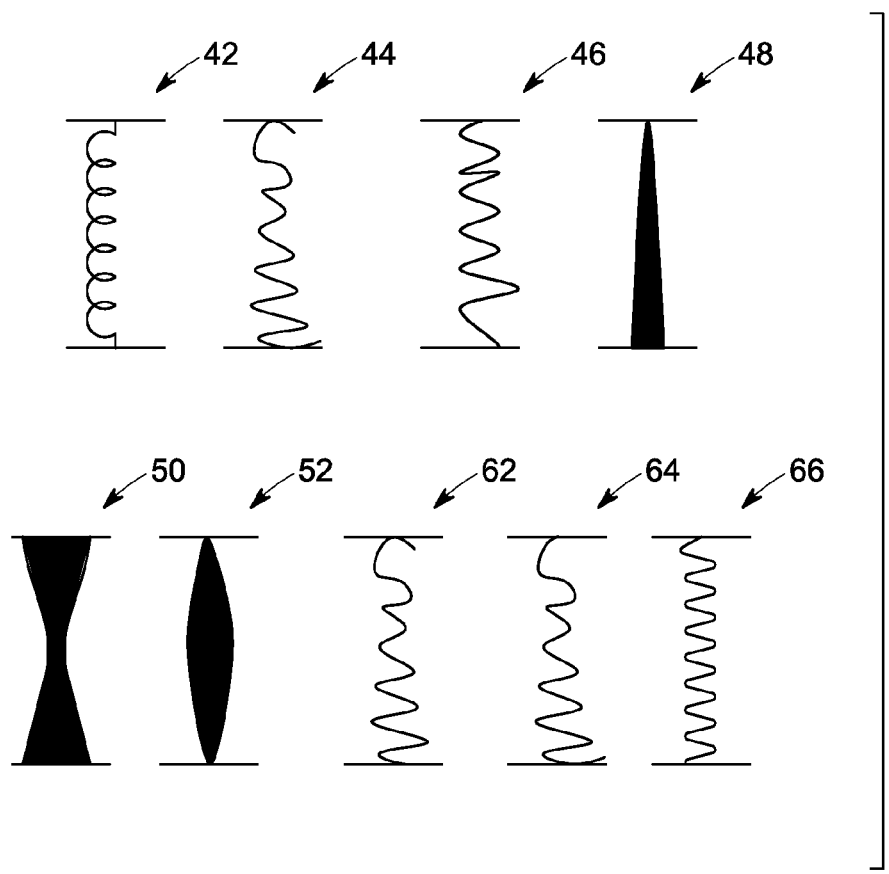
FIG. 4 is a diagrammatical representation of different nanosprings according to one embodiment of the invention.

In one embodiment, the plurality of nanosprings 20 comprises at least one nanospring with a curved structure 42 as depicted in the example FIG. 4, including at least one curved surface. A curved structure 42 means that the nanospring has at least one curved portion along a length of the nanospring. In one embodiment, at least about 50% of the plurality of nanosprings 20 have a curved structure 42. In another embodiment, at least about 90% of the plurality of nanosprings 20 have curved structure 42. In one more embodiment, at least one nanospring of the plurality of nanosprings 20 has a coiled structure 44. Another embodiment comprises at least about 90% of the nanosprings 20 having a coiled structure 44.

In one embodiment, the plurality of nanosprings 20 comprises at least one nanospring with a kinked structure 46, including at least one kinked surface. A kinked structure 46 means that the nanospring has at least one kinked portion along a length of the nanospring. As used herein a "kinked" portion is defined as a portion having a close twist or a sudden change in direction. In one embodiment, at least about 50% of the plurality of nanosprings 20 have a kinked structure 46. In another embodiment, at least about 90% of the plurality of nanosprings 20 have kinked structure 46.

In one more embodiment, at least one nanospring of the plurality of nanosprings 20 has a cone structure 48 including at least one cone surface. A further embodiment comprises at least about 90% of the nanosprings 20 having a cone structure 48. In one embodiment, the plurality of nanosprings 20 have a double cone structure, including at least one double cone surface 50 and/or 52 as shown in FIG. 4.

The nanosprings 20 of the thermal interface element 16 can be in thermal communication with the top layer 22 or bottom layer 24 through different surfaces. For example, the nanosprings 20 can contact the top layer 22 and/or bottom layer 24 with the ends or through one of the curved surfaces as depicted in structures 62, 64, and 66 in FIG. 4. In one embodiment, at least about 75% of the plurality of nanosprings 20 contact the top layer 22 and bottom layer 24 with the end surfaces of the nanosprings 20 as depicted in structure 66 of FIG. 4.

In one embodiment, the plurality of nanosprings 20 has a strong bonding with the top layer 22 and/or bottom layer 24. In one embodiment, the bonding force between the plurality of nanosprings and the layers 22, 24 is at least about 10 N/cm$^2$. In another embodiment, the plurality of nanosprings 20 has at least about 100 N/m$^2$ of force with the top layer 22 and with the bottom layer 24. In another particular embodiment, the plurality of nanosprings 20 has at least about 400 N/m$^2$ of force with the top layer 22 and with the bottom layer 24.

In one embodiment, the thermal interface element 16 is bonded to the heat source 12 and/or heat-sink 14 through a metallic bonding. In one specific embodiment, the thermal interface element 16 is bonded to the heat source 12 and/or the heat ink 14 through soldering. In one embodiment, the bonding between the plurality of nanosprings is bonded to the top layer 22 and/or bottom layer 24 through a metallic bonding. In one specific embodiment, the plurality of nanosprings 20 is bonded to the top layer 22 and/or bottom layer 24 through soldering. A variety of low temperature melting and high thermal conductivity materials can be used for soldering. One example of such a material is indium and low melting alloys of indium.

In one embodiment, the top layer 22 and bottom layer 24 act as a bond line for the plurality of nanosprings 20 with the heat source 12 and the heat-sink 14, respectively. In one embodiment, the thicknesses of the top layer 22 and bottom layer 24 acting as bond lines are less than about 1 mm In a further embodiment, the thicknesses of the top and bottom layers are less than about 100 µm. In one specific embodiment, the thicknesses of the top and bottom layers are less than about 30 µm.

In one embodiment, the top layer and the bottom layers have different thicknesses. Thin bond lines (bond layers) help in lowering the thermal resistances between the heat source 12 and heat-sink 14. However, thin bond lines reduce reliability, due to thermal strain when placed in between materials of dissimilar CTE. The compliance of the nanospring structures 16 reduces stress in the bond layer to maintain a longer fatigue life. The compliant spring structures move independently from one another during differential thermal expansion of the two materials being bonded together and relieves stress on the bond layer material. The spring constant of the nanosprings sum up to create a structure resistant to deflection under shear or normal loading. Generally, small size of the nanosprings and high spring density contribute to a comparatively high overall stiffness of the structure during both normal and shear loading.

In one embodiment, the top layer 22 and/or the bottom layer 24 are a combination of many bond layers (not shown).

In one embodiment, the bond layers have an ascending or descending CTE values. In one embodiment, a secondary bond layer exists between the top layer 22 and the heat source 12 and/or the bottom layer 24 and the heat-sink 14.

Another embodiment of the present invention is a method of preparing an article. The method comprises providing a heat source 12, providing a heat-sink 14, and disposing a thermal interface element 16 in thermal communication with the heat source 12 and the heat-sink 14. The thermal interface element 16 includes a top layer 22, a bottom layer 24, and a plurality of freestanding nanosprings 20 disposed between the top layer 22 and bottom layer 24. The nanosprings 20, top layer 22, and bottom layer 24 comprise at least one inorganic material.

In one embodiment, disposing the thermal interface element includes the steps of disposing a plurality of nanosprings on at least one side of a support 26, disposing the top layer 22 and/or bottom layer 24 on the ends of the plurality of nanosprings 20, and disposing the thermal interface element in between the heat source and the heat-sink. The "ends" as used herein may be the end surface of the nanosprings as in element 66 or the curved, coiled, or kinked surfaces as in, for example, element 62 of FIG. 4. In one embodiment, disposing a thermal interface element 16 includes disposing a plurality of nanosprings on both sides of a support 26, and disposing top layer 22 and/or bottom layer 24 on the plurality of nanosprings 20.

In one embodiment, disposing the thermal interface element includes the steps of disposing a plurality of nanosprings on at least one side of a support 26, disposing a top layer 22 on a surface of a heat source 12 and/or disposing a bottom layer 24 on a surface of a heat-sink 14, and disposing the nanosprings on the support 26 in between the top layer 22 and/or bottom layer 24.

The plurality of nano springs can be disposed in thermal communication with the heat source 12 and the substrate 14 using various methods. For example, the method of disposing the nanosprings 20 can be by any method selected from the group consisting of glancing angle deposition (GLAD), chemical vapor deposition (CVD), physical vapor deposition (PVD), electro deposition, plasma deposition, sol-gel, micromachining, laser ablation, rapid prototyping, sputtering, or any combination of these methods. In one embodiment, the plurality of nanosprings is disposed using a CVD method. In one embodiment, GLAD of a material at an oblique angle produces nanowire growth due to local shadowing caused by surface morphology. Rotation during PVD deposition produces helical nanowire structures.

In another embodiment, disposing the thermal interface element 16 includes the steps of disposing a plurality of freestanding nanosprings 20 on at least two sides of a support 22; and inserting the thermal interface element 16 in between the heat source 12 and the substrate 14. For example, the plurality of nanosprings 20 can be disposed on two sides of a rectangular support 22 of a finite thickness by GLAD of a material using oblique angle deposition on one side of the support 26 and oblique angle deposition on the other side of the support 26 or simultaneously on both sides of the support 26.

In one embodiment, the plurality of nanosprings 20 is disposed on the support 26 using an adhesive layer 28. In one embodiment, an adhesive layer functions as a top layer 22 or a bottom layer 24. In another embodiment, there is an adhesive layer 28 as well as a top or bottom layer 22, 24 in between the plurality of nanosprings 20 and the support 26.

During the preparation of an article, different methods can be used to dispose the top layer 22, bottom layer 24, plurality of nanosprings 20, and adhesive layer 28. For example, different deposition methods such as chemical vapor deposition (CVD), physical vapor deposition (PVD), glancing angle deposition (GLAD), electro chemical deposition, plasma deposition, sol-gel deposition can be used in single or in combination of any of the forgoing methods or any other methods.

In one embodiment, the top and/or bottom layers, and plurality of nanosprings are deposited using the GLAD method. The GLAD method is particularly useful in controlling the shapes, dimensions, and density of the layers and nanosprings (ref: U.S. Pat. No. 6,248,422B1). In one embodiment, the top and bottom layers have high density. In one embodiment, the top and bottom layers have a layer density greater than about 30%. In a further embodiment, the top and bottom layers are more than about 95% dense.

In one embodiment, the top and/or bottom layers are deposited using the GLAD method with a glancing angle in the range of about 0° to about 10°. In a further embodiment, the glancing angle used for the top or bottom layers deposition is in the range of about 3° to about 8°. In one embodiment, the plurality of nanosprings 20 is deposited using the GLAD method with a glancing angle in the range of about 78° to about 87°. In a further embodiment, the glancing angle used for the deposition of plurality of nanosprings is in the range of about 80° to about 85°.

In one embodiment, the thermal interface element 16 is deposited using an electrochemical deposition technique. In a further embodiment, a template is used for the electrochemical deposition of a plurality of nanosprings 20. A template can be used as a positive template or as a negative template. In a specific embodiment, both the plurality of nanosprings and the top layer 22 are deposited using an electrochemical method.

In an alternate method of producing a spring property for the nanosprings, a three dimensional template with openings of desired shapes and sizes can be used. In a slight alteration of the electrodeposition method described above, an integral template can be used over the support 26 for defining the size and shape of the nanosprings without necessarily removing the template. The integral template can be a two dimensional template or can be a three dimensional template with the thickness limited to a fraction of length of the nanosprings. In one related embodiment, the support material and the template may be of the same material or have a strong chemical bonding. In another embodiment, the template and the nanospring materials may be selected such that the plurality of nanosprings 20 and the template 72 are of same material or have a strong chemical bonding between the two. One example of an integral template 72 that can be used is anodized aluminum oxide (AAO). In specific instances, anodized aluminum oxide template may be etched away, for example using KOH, to allow for a freestanding nanospring structure.

EXAMPLES

The following examples illustrate methods, materials and results, in accordance with specific embodiments, and as such should not be construed as imposing limitations upon the claims. All components are commercially available from common chemical suppliers.

Example 1

Figure 5:
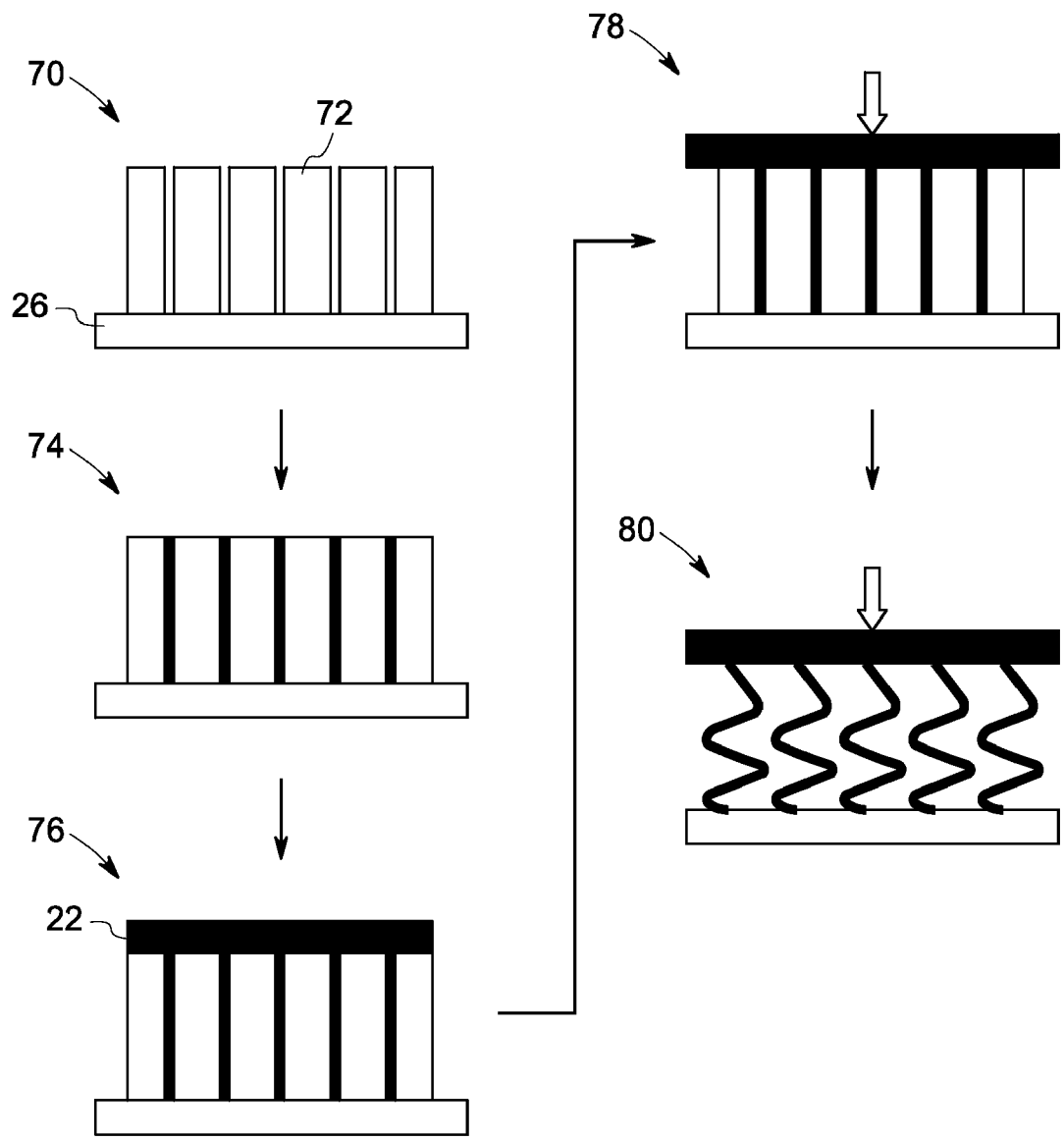
FIG. 5 is a schematic method of electrodeposition according to one embodiment of the invention.

FIG. 5 represents a schematic electrochemical deposition method of plurality of nanosprings 20, as an example. In this example, a support material 26 was provided over which a mask or template 72 is positioned in a step 70. The nanospring materials were electrochemically deposited over the mask in the step 74. A top layer 22 was also deposited using the electrochemical deposition in the step 76. The mask 72 was removed in step 78 and a force is applied to the resulting structure in step 80 to get the nanospring structure.

Figure 6:
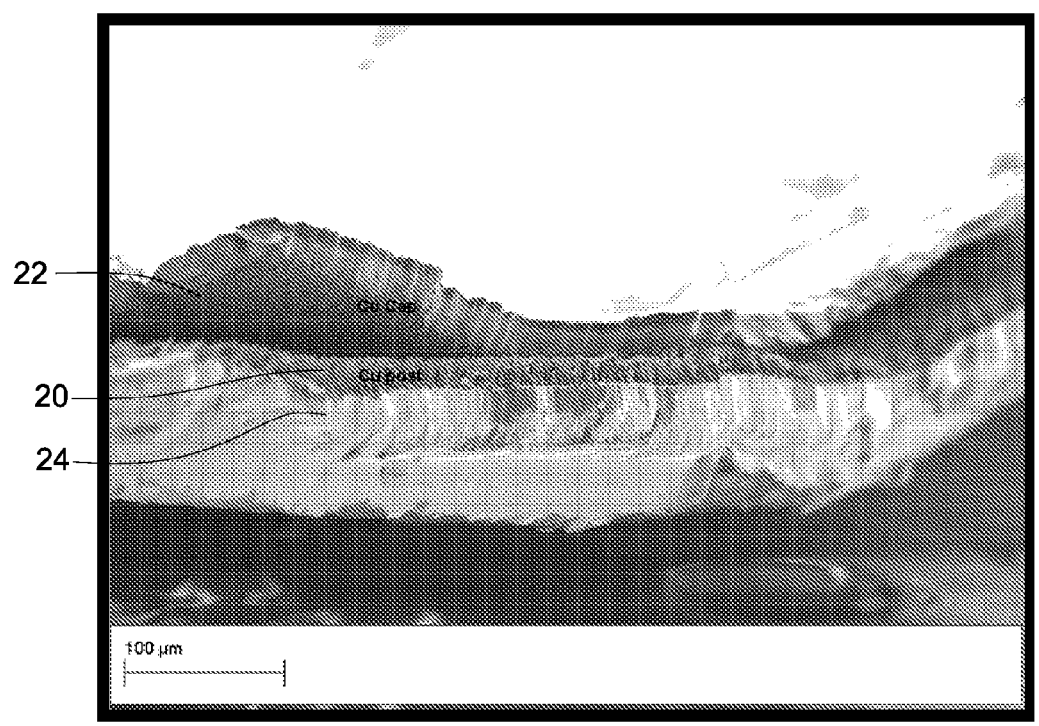
FIG. 6 is a scanning electron micrograph of the nanosprings and the top and bottom layers in an example.

FIG. 6 shows an example of a top layer 22, plurality of nanosprings 20, and the bottom layer 24 of Cu, deposited using the electrochemical deposition method.

Example 2

Figure 7:
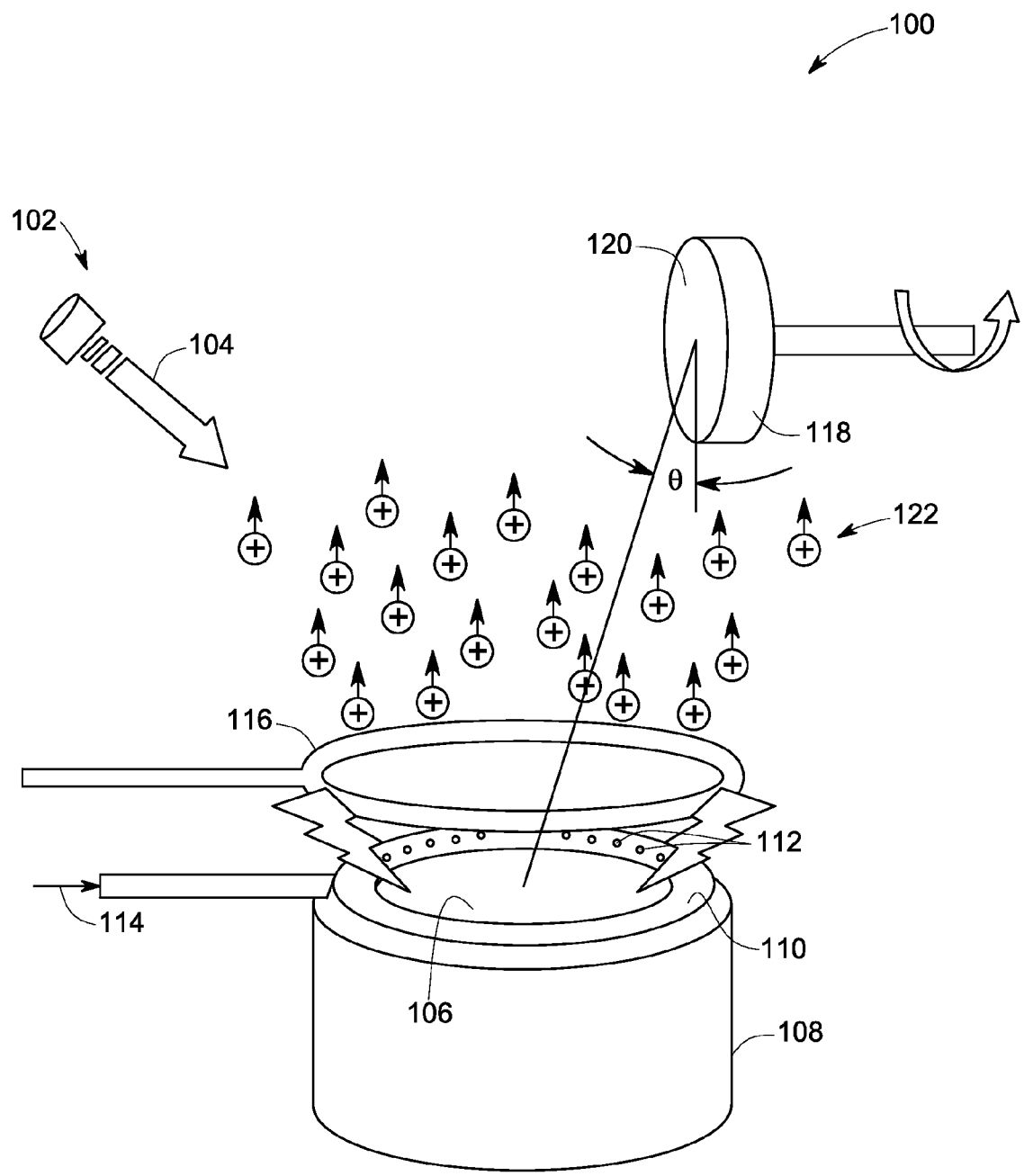
FIG. 7 is an illustration of an equipment and process for glancing angle deposition according to one embodiment of the invention.

FIG. 7 illustrates an Electron Beam Physical Vapor Deposition (EB-PVD) chamber 100 and technique for applying an optimized high emissive coating according to an embodiment of the invention, as an example. Chamber 100 includes an electron gun 102 configured to emit an electron beam 104 towards a target 106 constructed of, for example, copper or titanium. Target 106, having a diameter of approximately 68.5 mm, is placed into a water-cooled crucible 108. A gas distribution ring 110 having perforations 112 is positioned proximately to target 106 and is fed by a gas 114. For example, in one embodiment, gas 114 is argon. An electrode 116 is positioned proximately to target 106 between target 106 and a substrate 118. Electrode 116 is configured to discharge to target 106 when power is applied to electrode 116. The gas distribution ring 110 and the ionization electrode 116 are optional to use, depending on process conditions required. If gas 114 is fed, deposition at higher pressure can be achieved. If the electrode 116 is powered (e.g. with approximately 100 A at 30 V), electron beam 104 vaporizes material from target 106, which emits there from and is ionized by discharges from electrode 116 causing a flow of ionized vapor 122 to be present in chamber 100. Thus, highly ionized vapor flux can be achieved by powering the electrode 116 on.

In operation, substrate 118, having a surface 120 upon which a coating (nanospring, or a combination of nanospring and capping layer) is to be applied, was positioned at an angle θ with respect to target 106. In one example of titanium nanospring growth, the angle θ was 6.5°, however a range of angles between 3° and 12° may be equally applicable, depending on other combinations of settings and parameters applied during the coating process. This configuration of substrate relative to target during deposition is also called Glancing Angle Deposition (GLAD). The glancing angle α in GLAD growth is defined as the arrival angle of vapor flux to the normal of a depositing surface. Since α is equal to 90°−θ, corresponding GLAD glancing angle is in the range from about 78° to about 87°.

Prior to deposition, chamber 100 was pumped to a vacuum below $10^{-5}$ torr. Substrate 118 was rotated at 1 rpm rate during the process. Electron gun 102 was configured to emit an electron beam of 1.2-1.4 A having a 18 kV accelerating voltage and scan target 106. During growth of Ti nanosprings, surface 120 of substrate 118 was maintained at below 400° C. and was maintained at an angle θ of approximately 6.5° with respect to target 106. After growth of nanosprings to a desired height, a cap layer can also be formed atop the nanosprings in the same system. If a cap layer is desired at the end of nanosprings, the substrate can be moved to increase the θ angle gradually to 45° while rotating at higher speed (e.g. 20 RPM). If a dense capping layer is desired, the electrode 116 can be powered with approximately 100 A at 30 V so that a highly ionized vapor flux will arrive at the substrate surface to densify the cap layer. The substrate 118 may be pre-patterned with a periodic array of small protrusions or seeds (e.g., by block copolymer template), to intercept vapor flux and control the nucleation location, so that a uniform nanospring pattern with controlled spacing between features may be fabricated.

FIGS. 8 and 9 show two examples a plurality of nanosprings 20 deposited using GLAD method. FIG. 8 shows copper nanosprings grown on a pattern of tungsten bumps formed in a tungsten substrate. FIG. 9 shows copper nanosprings grown on a silicon substrate and capped with a copper top layer.

FIG. 10 schematically illustrates a thermal interface material. The copper nanosprings 132 were grown on a tungsten substrate 134 using the GLAD process. The copper nanosprings were capped with a copper layer 136. The sample with nanosprings 132, substrate 134, and cap layer 136 was soldered between silicon heat source 138 and copper heat-sink 140 using indium solder 142 with the help of thin Ni/Au adhesion layers 144. In one example, the thermal resistance of copper nanosprings 132 (2 turns) grown on the tungsten substrate 134 and capped with copper 136 was measured to be less than about 0.017 $cm^2C/W$. The thermal resistance includes the resistance of the solder layer 142 and adhesion layers 144.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An article comprising:
   a heat source;
   a heat-sink; and
   a thermal interface element disposed in thermal communication with the heat source and the heat-sink through at least one solder layer, the thermal interface element comprising a top layer having an accommodative CTE with the heat source; a bottom layer having an accommodative CTE with the heat-sink; and a plurality of freestanding nanosprings between the top layer and bottom layers,
   wherein the plurality of nanosprings consists essentially of inorganic material, and wherein the top layer, and the bottom layers have a thickness less than about 100 μm and comprise copper, aluminum, silver, platinum, tungsten, silicon, zinc oxide, silicon nitride, molybdenum, tantalum, or any combinations of the foregoing.

2. The article of claim 1, wherein the inorganic material comprises a metallic material, an alloy, a ceramic, or a composite.

3. The article of claim 2, wherein the inorganic material comprises copper, aluminum, silver, gold, platinum, tungsten, silicon, zinc oxide, silicon nitride, titanium, molybdenum, tantalum, or any combinations of the foregoing.

4. The article of claim 1, wherein the plurality of nanosprings has a median spring diameter in a range from about 10 nm to about 2 μm.

5. The article of claim 1, wherein the thermal interface element comprises at least about $10^8$ nanosprings/$cm^2$.

6. The article of claim 1, wherein the nano springs have a kinked structure.

7. The article of claim 1, wherein the nano springs have a non-uniform diameter as a function of length.

8. The article of claim 7, wherein the nanosprings have a cone structured diameter.

9. The article of claim 1, wherein the heat source is an electronic device.

10. The article of claim 9, wherein the electronic device comprises a semiconductor device.

11. The article of claim 1, wherein at least one bonding layer exists between the top layer and the heat source.

12. The article of claim 1, wherein at least one bonding layer exists between the bottom layer and the heat-sink.

13. A method of preparing an article comprising:
providing a heat source;
providing a heat-sink; and
disposing a thermal interface element in thermal communication with the heat source and the heat-sink using at least one solder layer, the thermal interface element comprising a top layer having an accommodative CTE with the heat source; a bottom layer having an accommodative CTE with the heat-sink; and a plurality of freestanding nanosprings between the top and bottom layers,
wherein the plurality of nanosprings consists essentially of inorganic material, and wherein the top and the bottom layers have a thickness less than about 100 μm and comprise copper, aluminum, silver, platinum, tungsten, silicon, zinc oxide, silicon nitride, molybdenum, tantalum, or any combinations of the foregoing.

14. The method of claim 13, wherein disposing the thermal interface element comprises:
disposing a plurality of nanosprings on at least one side of a support;
disposing the top or bottom layer on at least one end of the plurality of nanosprings; and
disposing the thermal interface element in between the heat source and the heat-sink using the at least one solder layer.

15. The method of claim 14, wherein disposing the plurality of nano springs is by a deposition method comprising chemical vapor deposition (CVD), physical vapor deposition (PVD), glancing angle deposition (GLAD), electrochemical deposition, plasma deposition, sol-gel deposition, or any combination thereof.

16. The method of claim 15, wherein the deposition method comprises GLAD having a glancing angle in the range from about 78° to about 87°.

17. The method of claim 15, wherein the deposition method comprises electrochemical deposition conducted over a template.

18. The method of claim 17, wherein the deposition method comprises
providing a support;
positioning a mask over the support;
electrochemically depositing the nanospring materials over the mask to create a deposit of plurality of nano springs; and
removing the mask leaving the deposit behind,
wherein the mask comprises a porous membrane having tortuous pathways through the membrane thickness.

19. The method of claim 14, wherein disposing the top or bottom layer is by a deposition method comprising chemical vapor deposition (CVD), physical vapor deposition (PVD), glancing angle deposition (GLAD), electro chemical deposition, plasma deposition, sol-gel deposition, or any combination thereof.

20. The method of claim 19, wherein the deposition method comprises GLAD having a glancing angle in the range from about 0° to about 10°.

21. The method of claim 14, wherein the top and bottom layers have a density greater than about 90%.

22. The method of claim 13, wherein disposing the thermal interface element comprises:
disposing a plurality of nanosprings on at least two sides of a support;
disposing the cap on at least one end of the nanosprings; and
disposing the thermal interface element in between the heat source and the heat-sink using the at least one solder layer.

23. The method of claim 1, wherein the solder layer comprises indium.

* * * * *

UNITED STATES PATENT AND TRADEMARK OFFICE
CERTIFICATE OF CORRECTION

Page 1 of 2

PATENT NO. : 8,405,996 B2
APPLICATION NO. : 12/826337
DATED : March 26, 2013
INVENTOR(S) : Shaddock et al.

It is certified that error appears in the above-identified patent and that said Letters Patent is hereby corrected as shown below:

In the Specifications:

In Column 4, Line 21, delete "24" and insert -- 14 --, therefor.

In Column 4, Line 25, delete "24" and insert -- 14 --, therefor.

In Column 4, Line 33, delete "22." and insert -- 26. --, therefor.

In Column 6, Line 32, delete "heat ink" and insert -- heat sink --, therefor.

In Column 6, Line 45, delete "mm" and insert -- mm. --, therefor.

In Column 6, Lines 50-65, delete "In one.........loading." and insert the same at Line 49 after "30 μm." as a continuation paragraph.

In Column 7, Line 35, delete "nano springs" and insert -- nanosprings --, therefor.

In Column 7, Line 52, delete "22;" and insert -- 26; --, therefor.

In Column 7, Line 55, delete "22" and insert -- 26 --, therefor.

In the Claims:

In Column 10, Lines 55-56, in Claim 4, delete "nano springs" and insert -- nanosprings --, therefor.

In Column 10, Line 60, in Claim 6, delete "nano springs" and insert -- nanosprings --, therefor.

Signed and Sealed this
Fourth Day of June, 2013

Teresa Stanek Rea
*Acting Director of the United States Patent and Trademark Office*

CERTIFICATE OF CORRECTION (continued)
U.S. Pat. No. 8,405,996 B2

In Column 10, Line 62, in Claim 7, delete "nano springs" and insert -- nanosprings --, therefor.

In Column 11, Line 35, in Claim 15, delete "nano springs" and insert -- nanosprings --, therefor.

In Column 12, Line 8, in Claim 18, delete "comprises" and insert -- comprises: --, therefor.

In Column 12, Lines 12-13, in Claim 18, delete "nano springs;" and insert -- nanosprings; --, therefor.